(12) United States Patent
Ohama et al.

(10) Patent No.: US 7,079,660 B2
(45) Date of Patent: Jul. 18, 2006

(54) BASS COMPENSATION DEVICE AND A SOUND SYSTEM USING THE DEVICE

(75) Inventors: Shigeji Ohama, Kyoto (JP); Hiroyuki Saito, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 155 days.

(21) Appl. No.: 10/121,604

(22) Filed: Apr. 15, 2002

(65) Prior Publication Data

US 2002/0150255 A1 Oct. 17, 2002

(30) Foreign Application Priority Data

Apr. 16, 2001 (JP) .............................. 2001-116325
Apr. 16, 2001 (JP) .............................. 2001-116326

(51) Int. Cl.
*H03G 5/00* (2006.01)

(52) U.S. Cl. .................... 381/98; 381/101; 381/103; 381/61

(58) Field of Classification Search .................. 381/27, 381/17, 18–19, 307, 61, 98, 101, 103
See application file for complete search history.

(56) References Cited

U.S. PATENT DOCUMENTS

| 4,739,514 | A | * | 4/1988 | Short et al. | ................. 381/103 |
| 5,668,885 | A | * | 9/1997 | Oda | ............................ 381/98 |
| 5,923,766 | A | * | 7/1999 | Oda | ............................ 381/98 |
| 6,424,719 | B1 | * | 7/2002 | Elko et al. | ...................... 381/1 |

* cited by examiner

*Primary Examiner*—Vivian Chin
*Assistant Examiner*—Justin Michalski
(74) *Attorney, Agent, or Firm*—Morgan, Lewis & Bockius, LLP

(57) ABSTRACT

The bass compensation device of the present invention includes a high frequency removing circuit for removing a high frequency component of an input sound signal; an absolute value circuit for full-wave rectifying an output signal of the high frequency removing circuit; a band limit circuit for selectively passing only a predetermined frequency range component from the output signal of the absolute value circuit; and an amplifier for amplifying the output signal of the band limit circuit, and bass compensation is performed by the output signal of the amplifier. This structure can realize a bass compensation device excellent in distortion-factor property and transient property.

11 Claims, 9 Drawing Sheets

BASS COMPENSATION DEVICE AND A SOUND SYSTEM USING THE DEVICE

BACKGROUND OF THE INVENTION

1. Field of the Invention

The present invention relates to a bass compensation device for, when a sound signal is reproduced by using a compact speaker, a headphone, or the like, compensating insufficient bass reproduction resulting from a narrow reproducible band of the bass side and realizing the reproduction of rich deep bass, and also relates to a sound system using this device.

2. Description of the Prior Art

The frequency ranges of sound signals input from a sound source are generally wider than the reproducible frequency range of a speaker in use. Therefore, in order to reproduce sound signals input from the sound source faithfully, it is necessary to provide a speaker having as wide a reproducible frequency range as possible. Each speaker has its own reproducible frequency range depending on its size and structure; in general, compact speakers have higher limits of reproducible frequency ranges at the bass side, thereby deteriorating the reproduction characteristic of bass.

However, speakers or headphones which are applied to portable devices like portable (note-type) PC or portable audio reproduction devices, to compact audio systems whose concept is space saving, and to car audio systems to be installed in a limited space inside a car have been expected to be as compact and lightweight as possible because of the limitation of their installing sites, and other reasons. This sacrifices the reproduction properties of bass, causing users to complain about insufficient reproduction of bass.

In order to solve these problems, conventional audio systems have a bass intensifying circuit built therein to compensate a low frequency component. FIG. 8 is a block diagram showing an example of the conventional bass intensifying circuits. The bass intensifying circuit having this structure is disclosed, for example, in Japanese Laid-Open Patent Application No. H08-237800.

As shown in the drawing, the conventional bass intensifying circuit includes an adder 80 that adds an L channel component $L_{IN}$ and an R channel component $R_{IN}$ of a input sound signal; a first low pass filter 81 (hereinafter referred to as the first LPF 81) that extracts a tone component lower than the reproduction limit of the speaker in use from the output signal of the adder 80; a full wave rectifier 82 that full-wave rectifies output signal A' of the first LPF 81; a second low pass filter 83 (hereinafter referred to as the second LPF 83) that extracts only second harmonics from output signal B' of the full wave rectifier 82; an amplifier 84 that amplifies output signal C' of the second LPF 83, and adders 85, 86 that add output signal D' of the amplifier 84 to the L channel component $L_{IN}$ and the R channel component $R_{IN}$ of the sound signal, thereby generating an L channel component $L_{OUT}$ and an R channel component $R_{OUT}$ for output.

FIG. 9 is a time chart showing waveform examples of output signals A', B', and D'. As shown in the drawing, when a sound signal is input into the bass intensifying circuit having the above structure, output signal D' shapes a waveform which is twice the frequencies of output signal A'.

In the bass intensifying circuit having the above-mentioned structure, a low frequency component less than the reproduction limit of the speaker can be shifted to the frequency range of an octave higher to return to the original sound signal. Thus, the low frequency component which used to be absent can be compensated to realize powerful bass reproduction.

However, as shown in FIG. 9, the above-mentioned bass intensifying operation can be properly performed only when the second LPF 83 is in a steady state, whereas immediately after the sound signal is input or in the transition period immediately after the reception of the sound signal is completed, unnecessary DC components due to a transient phenomenon may be superimposed on output signal D', thereby causing objectionable noise from the speaker.

An input sound signal may contain a super bass frequency component that cannot be inside the reproducible band of the speaker even if the frequencies are doubled. This may cause the speaker to have unnecessary vibration, thereby distorting the reproduced sound.

In the bass intensification by the conventional bass intensifying circuit, there are cases where the reproduction of a super low frequency component seems to be insufficient.

The conventional bass intensifying circuit having the above structure is not provided with means for removing a low frequency component less than the reproduction limit of the speaker from the input sound signal, which has the possibility of causing the speaker to have unnecessary vibration, thereby distorting the reproduced sound.

SUMMARY OF THE INVENTION

In view of the above problems, the object of the present invention is to provide a bass compensation device capable of compensating insufficient bass reproduction resulting from narrow reproducible band at the bass side when sound signals are reproduced by using compact speakers, headphones, or the like, thereby reproducing rich deep bass with little distortion, and also to provide a sound system using this device.

In order to achieve the object, the bass compensation device of the present invention includes: a high frequency removing circuit for removing a high frequency component of an input sound signal; an absolute value circuit for full-wave rectifying an output signal of said high frequency removing circuit; a band limit circuit for selectively passing only a predetermined frequency range component from an output signal of said absolute value circuit; and an amplifier for amplifying an output signal of said band limit circuit, wherein bass compensation is performed by an output signal of said amplifier.

The sound system of the present invention is composed of a sound source for generating sound signals, a bass compensation device for performing bass compensation of the sound signals input from the sound source, and a sound output device for outputting sound signals input from the sound source and the bass compensation device as sound, and includes: a high frequency removing circuit for removing a high frequency component of a sound signal input from the sound source; an absolute value circuit for full-wave rectifying an output signal of said high frequency removing circuit; a band limit circuit for selectively passing only a predetermined frequency range component from an output signal of said absolute value circuit; and an amplifier for amplifying an output signal of said band limit circuit.

DESCRIPTION OF THE DRAWINGS

FIG. 6 is a block diagram showing a structural example of the conventional bass intensifying circuit.

DESCRIPTION OF THE PREFERRED EMBODIMENTS

Figure 1:
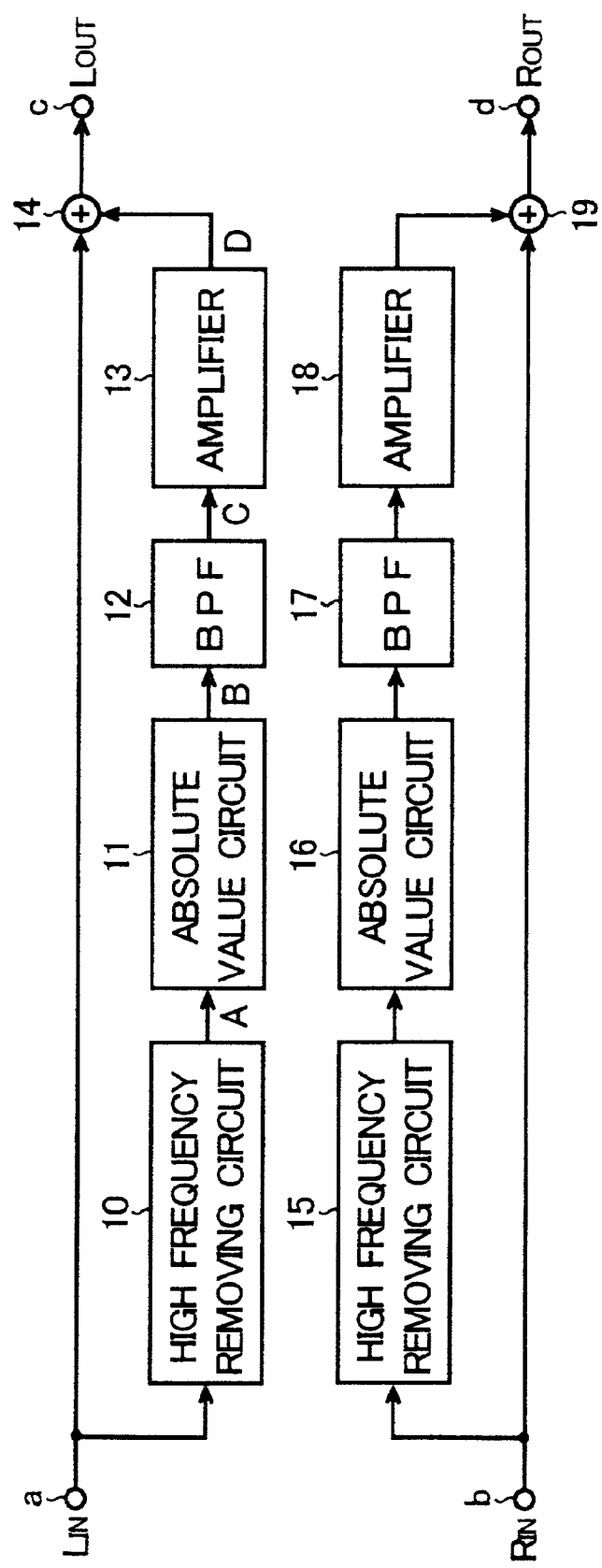
FIG. 1 is a block diagram showing the first embodiment of the bass compensation device of the present invention.

The first embodiment of the bass compensation device of the present invention will be described first. FIG. 1 is a block diagram of the first embodiment of the bass compensation device of the present invention. The following description will take as an example the case where a sound signal input from the sound source is a stereo signal containing an L channel component and an R channel component.

As shown in the drawing, the bass compensation device of the present embodiment includes a high frequency removing circuit 10 which removes a high frequency component from the L channel component $L_{IN}$ of the sound signal input to a terminal "a"; an absolute value circuit 11 which full-wave rectifies output signal A of the high frequency removing circuit 10; a band pass filter 12 (hereinafter referred to as the BPF 12) which selectively passes only a predetermined frequency range component from output signal B of the absolute value circuit 11; an amplifier 13 which amplifies output signal C of the BPF 12; and an adder 14 which adds output signal D of the amplifier 13 to the original L channel component $L_{IN}$, and outputs the resulting signal from a terminal "c" as an L channel component $L_{OUT}$.

The bass compensation device of the present embodiment includes a high frequency removing circuit 15 which removes a high frequency component from the R channel component $R_{IN}$ of the sound signal input to a terminal "b"; an absolute value circuit 16 which full-wave rectifies the output signal of the high frequency removing circuit 15; a band pass filter 17 (hereinafter referred to as the BPF 17) which selectively passes only a predetermined frequency range component from the output signal of the absolute value circuit 16; an amplifier 18 which amplifies the output signal of the BPF 17; and an adder 19 which adds the output signal of the amplifier 18 to the original R channel component $R_{IN}$, and outputs the resulting signal from a terminal "d" as an R channel component $R_{OUT}$.

The terminals "c" and "d" are connected to an unillustrated speaker. If an additional speaker for bass reproduction can be provided besides the speaker, the adders 14, 19 do not need to be installed; the output terminals of the amplifiers 13, 18 can be directly connected to the additional speaker for bass reproduction.

Figure 2:
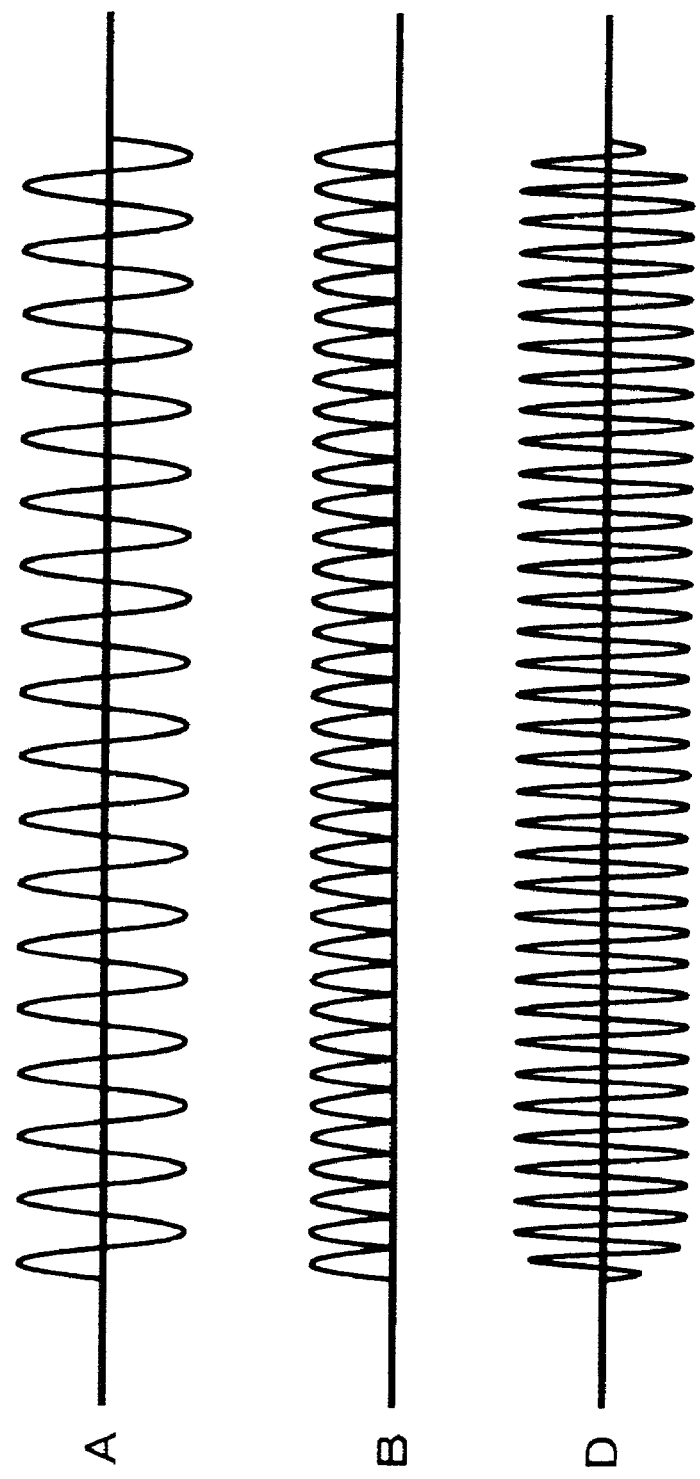
FIG. 2 is a time chart showing waveform examples of output signals A, B, and D.

The signal processing in the bass compensation device having the above-described structure will be described as follows with reference to FIGS. 1 and 2. FIG. 2 is a time chart showing waveform examples of output signals A, B, and D. Although the following description will be focused on the signal processing of an L channel component, the same signal processing is applied to an R channel component.

The L channel component $L_{IN}$ of a sound signal input from the sound source to the terminal "a" is input to the high frequency removing circuit 10 and to the adder 14. The high frequency removing circuit 10 is composed of a low pass filter or the like having a predetermined cut-off frequency, and has the property of passing a frequency component lower than the cut-off frequency. The main function of the high frequency removing circuit 10 is to remove burst high frequency noise input into the terminal "a". Therefore, the cut-off frequency of the high frequency removing circuit 10 has only to be set lower than the frequency range of the high frequency noise. This structure enables the high frequency noise to be frequency-converted, thereby avoiding or reducing the occurrence of noise from the speaker.

In the bass compensation device of the present embodiment, the cut-off frequency of the high frequency removing circuit 10 is set at around the bass-side cutoff frequency of the speaker. This setting makes the high frequency removing circuit 10 of the present embodiment not only remove high frequency noise from the L channel component $L_{IN}$ of the sound signal but also function to extract a frequency component lower than the reproduction limit of the speaker.

The absolute value circuit 11 full-wave rectifies output signal A of the high frequency removing circuit 10. As an example of the absolute value circuit 11, a bridge circuit composed of diodes can be used. The use of the absolute value circuit 11 to convert the frequency of a bass component into a doubled frequency can realize a user-friendly bass compensation device with high linearity of input/output properties.

The BPF 12 selectively passes only a predetermined frequency range component from output signal B of the absolute value circuit 11. Installing not a low pass filter but a band pass filter at the latter stage of the absolute value circuit 11 in this manner makes it possible to extract second harmonics from output signal B and to remove an unnecessary DC component due to the transient phenomenon immediately after the input of a sound signal or immediately after the completion of the sound signal. Thus a bass compensation device, excellent in distortion-factor property and transient property, can be achieved.

The amplifier 13 amplifies output signal C of the BPF 12 to the amplitude level of output signal A. The adder 14 adds output signal D of the amplifier 13 to the original L channel component $L_{IN}$, and outputs the resulting signal from the terminal "c" as an L channel component $L_{OUT}$. This bass compensating operation makes a low frequency component less than the reproduction limit of the speaker be shifted to the frequency range of an octave higher to return to the original sound signal. Thus, the low frequency component which used to be absent can be reproduced to realize powerful bass reproduction.

Figure 3:
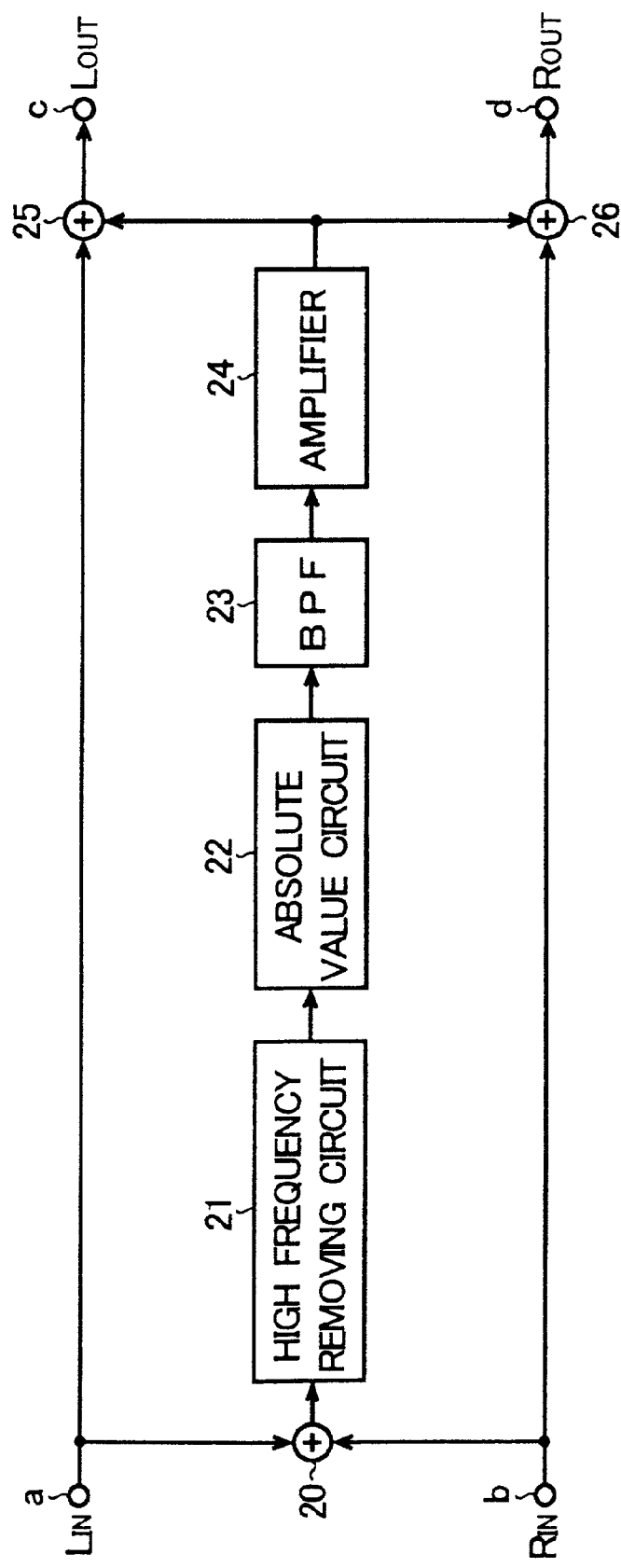
FIG. 3 is a block diagram showing the second embodiment of the bass compensation device of the present invention.

Next, the second embodiment of the bass compensation device of the present invention will be described. FIG. 3 is a block diagram showing the second embodiment of the bass compensation device of the present invention. The bass compensation device of the present embodiment is structured on the precondition that a sound signal input from the sound source is a stereo signal containing an L channel component and an R channel component.

As shown in the drawing, the bass compensation device of the present embodiment includes an adder 20 which adds an L channel component $L_{IN}$ of a sound signal input to the terminal "a" and an R channel component $R_{IN}$ of a sound signal input to the terminal "b", a high frequency removing circuit 21 which removes a high frequency component from the output signal of the adder 20; an absolute value circuit 22 which full-wave rectifies the output signal of the high frequency removing circuit 21; a band pass filter 23 (hereinafter referred to as the BPF 23) which selectively passes only a predetermined frequency range component from the output signal of the absolute value circuit 22; an amplifier 24 which amplifies the output signal of the BPF 23; an adder 25 which adds the output signal of the amplifier 24 to the original L channel component $L_{IN}$, and outputs the resulting signal from the terminal "c" as an L channel component $L_{OUT}$, and an adder 26 which adds the output signal of the amplifier 24 to the original R channel component $R_{IN}$, and outputs the resulting signal from the terminal "d" as an R channel component $R_{OUT}$.

The bass compensating operations of the high frequency removing circuit 21, the absolute value circuit 22, the BPF 23, and the amplifier 24 are the same as in Embodiment 1, so detailed descriptions will be omitted. This structure makes it possible to unify the signal system necessary for the bass compensating operations. Consequently, the circuit size can be reduced compared with the bass compensation device of the first embodiment.

Figure 4:
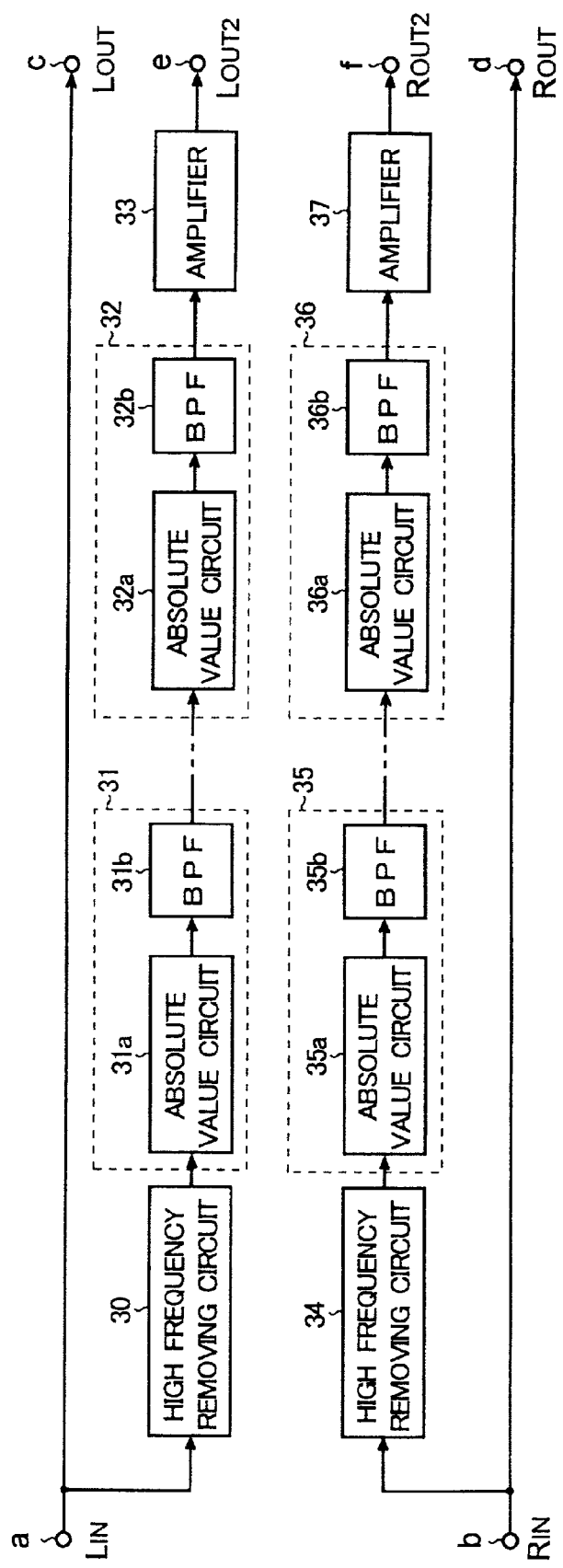
FIG. 4 is a block diagram showing the third embodiment of the bass compensation device of the present invention.

Next, the third embodiment of the bass compensation device of the present invention will be described. FIG. 4 is a block diagram showing the third embodiment of the bass compensation device of the present invention. The following description will take as an example the case where a sound signal input from the sound source is a stereo signal containing an L channel component and an R channel component.

As shown in the drawing, the bass compensation device of the present embodiment includes a high frequency removing circuit 30 which removes a high frequency component from the L channel component $L_{IN}$ of a sound signal input to the terminal "a"; n-stage harmonic tone circuit units 31–32 connected in series to the output terminal of the high frequency removing circuit 30; an amplifier 33 which amplifies the output signal of the harmonic tone circuit unit 32 and outputs the amplified signal from the terminal "e" as a bass L channel component $L_{OUT2}$. The L channel component $L_{IN}$ is output from the terminal "c" as the L channel component $L_{OUT}$.

The bass compensation device of the present embodiment includes a high frequency removing circuit 34 which removes a high frequency component from the R channel component $R_{IN}$ of a sound signal input to the terminal "b"; n-stage harmonic tone circuit units 35–36 connected in series to the output terminal of the high frequency removing circuit 34; an amplifier 37 which amplifies the output signal of the harmonic tone circuit unit 36 and outputs the amplified signal from the terminal "f" as a bass R channel component $R_{OUT2}$. The R channel component $R_{IN}$ is outputted as it is from the terminal "d" as the R channel component $R_{OUT}$.

The terminals "c" and "d" are connected to an unillustrated speaker, and the terminals "e" and "f" are connected to an unillustrated speaker for bass reproduction. If this additional speaker for bass reproduction is not installed, it is possible that the output signals of the amplifiers 33, 37 are added to the L channel component $L_{IN}$ and the R channel component $R_{IN}$, respectively, so as to output them from the terminals "c" and "d" as in the preceding embodiment.

The harmonic tone circuit units 31–32 and 35–36 are composed of absolute value circuits 31a–32a and 35a–36a, respectively, which full-wave rectify input signals and band pass filters 31b–32b and 35b–36b, respectively, (hereinafter referred to as the BPF 31b–32b and the 35b–36b) which selectively pass only a predetermined frequency band component from the output signal of each absolute value circuit.

The harmonic tone circuit units 31–32 and 35–36 having the above-mentioned structure convert the frequency of an input signal into a double frequency and output them through the same operations (refer to FIG. 2) as in the preceding embodiment. Consequently, the output signals outputted from the n-th stage harmonic tone circuit units 32, 36 have double frequencies of the original signals.

The high tone-side cut-off frequencies of the BPF 31b–32b and 35b–36b composing each harmonic tone circuit unit are properly set depending on the frequency range of the output signal generated in each harmonic tone circuit unit. For example, when the frequency of the original signal is "f", the frequencies of the output signals outputted from the n-th stage harmonic tone circuit units 32, 36 become $f \times 2^n$. Therefore, setting the high tone-side cut-off frequencies of the BPF 32b, 36b higher than $f \times 2^n$ enables to generate output signals to be outputted properly.

As described hereinbefore, in the bass compensation device of the present embodiment, the harmonic tone circuit units, which convert the frequencies of input signals into doubled frequencies and output them, are connected in n-stages in series. This structure allows an input bass (low frequency) component to be shifted to the frequency range of an octave higher and then to be output. Thus, it becomes possible to reproduce a super bass component which can not be input into the reproducible range of the speaker only by doubling the frequency, thereby realizing more powerful bass reproduction.

Figure 5:
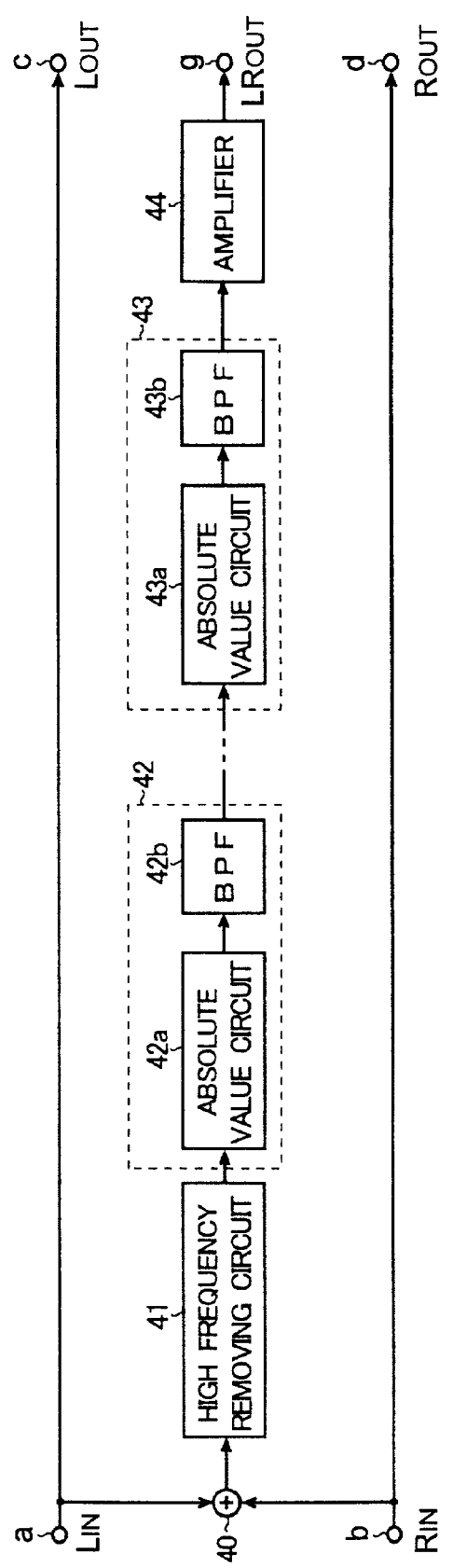
FIG. 5 is a block diagram showing the fourth embodiment of the bass compensation device of the present invention.

Next, the fourth embodiment of the bass compensation device of the present invention will be described. FIG. 5 is a block diagram showing the fourth embodiment of the bass compensation device of the present invention. The bass compensation device of the present embodiment is structured on the precondition that a sound signal input from the sound source is a stereo signal containing an L channel component and an R channel component.

As shown in the drawing, the bass compensation device of the present embodiment includes an adder 40 which adds an L channel component $L_{IN}$ of a sound signal input to the terminal "a" and an R channel component $R_{IN}$ of a sound signal input to the terminal "b", a high frequency removing circuit 41 which removes a high frequency component from the output signal of the adder 40; n-stage harmonic tone circuit units 42–43 connected in series to the output terminal of the high frequency removing circuit 41; and an amplifier 24 which amplifies the output signal of the harmonic tone circuit unit 43 and outputs the amplified signal from the terminal "g" as a bass LR channel component $LR_{OUT}$.

The L channel component $L_{IN}$ is output as it is from the terminal "c" as an L channel component $L_{OUT}$, and the R channel component $R_{IN}$ is output as it is from the terminal "d" as an R channel component $R_{OUT}$.

The above-mentioned terminals "c" and "d" are connected to an unillustrated speaker, and the terminal "g" is connected to an unillustrated speaker for bass reproduction. If this additional speaker for bass reproduction is not installed, it is possible that the output signal of the amplifier 44 is added to the L channel component $L_{IN}$ and the R channel component $R_{IN}$, so as to output them from the terminals "c" and "d" as in the preceding embodiment.

The bass compensating operations of the high frequency removing circuit 41 and the harmonic tone circuit units 42–43 are the same as in the third embodiment, so detailed descriptions will be omitted. This structure makes it possible to unify the signal system necessary for the bass compensating operations. Consequently, the circuit size can be reduced compared with the bass compensation device of the third embodiment.

Figure 6:
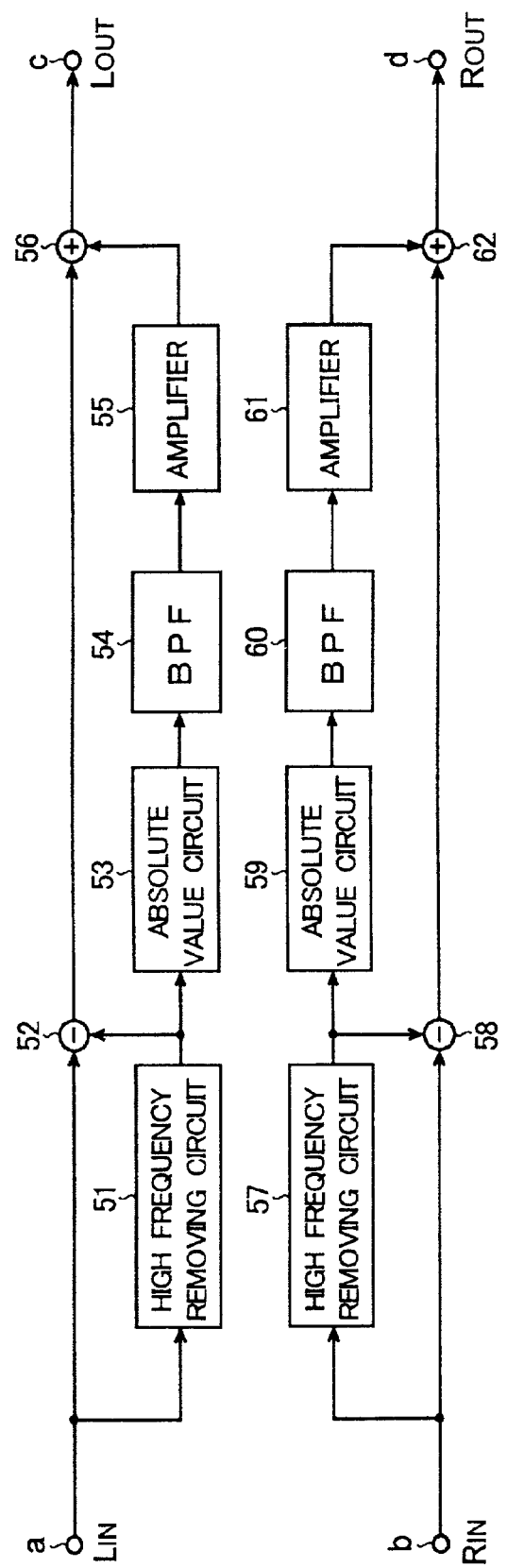
FIG. 6 is a block diagram showing the fifth embodiment of the bass compensation device of the present invention.

Next, the fifth embodiment of the bass compensation device of the present invention will be described. FIG. 6 is a block diagram showing the fifth embodiment of the bass compensation device of the present invention. The following description will take as an example the case where a sound signal input from the sound source is a stereo signal containing a L channel component and an R channel component.

As shown in the drawing, the bass compensation device of the present embodiment includes a high frequency removing circuit 51 which removes a high frequency component from the L channel component $L_{IN}$ of a sound signal input to the terminal "a"; a subtracter 52 which subtracts the output signal of the high frequency removing circuit 51 from the L channel component $L_{IN}$; an absolute value circuit 53 which full-wave rectifies the output signal of the high frequency removing circuit 51; a band pass filter 54 (hereinafter referred to as the BPF 54) which selectively passes only a predetermined frequency range component from the output signal of the absolute value circuit 53; an amplifier 55 which amplifies the output signal of the BPF 54; an adder 56 which adds the output signal of the amplifier 55 to the output signal of the subtracter 52, and outputs the resulting signal from the terminal "c" as an L channel component $L_{OUT}$.

The bass compensation device of the present embodiment includes a high frequency removing circuit 57 which removes a high frequency component from the R channel component $R_{IN}$ of a sound signal input to the terminal "b"; a subtracter 58 which subtracts the output signal of the high frequency removing circuit 57 from the R channel component $R_{IN}$; an absolute value circuit 59 which full-wave rectifies the output signal of the high frequency removing circuit 57; a band pass filter 60 (hereinafter referred to as the BPF 60) which selectively passes only a predetermined frequency range component from the output signal of the absolute value circuit 59; an amplifier 61 which amplifies the output signal of the BPF 60; an adder 62 which adds the output signal of the amplifier 61 to the output signal of the subtracter 58, and outputs the resulting signal from the terminal "d" as an R channel component $R_{OUT}$.

The above-mentioned terminals "c" and "d" are connected to an unillustrated speaker. If an additional speaker for bass reproduction can be installed besides the speaker, the adders 56, 62 do not need to be installed; the output terminals of the amplifiers 55, 61 can be directly connected to the additional speaker for bass reproduction.

The bass compensation device of the present embodiment having the above structure performs the same bass compensating operations as the first embodiment by using the high frequency removing circuit 51, the absolute value circuit 53, the BPF 54, the amplifier 55, the high frequency removing circuit 57, the absolute value circuit 59, the BPF 60, and the amplifier 61, and is characterized by subtracting the output signals of the high frequency removing circuits 51, 57 from the L channel component $L_{IN}$ and the R channel component $R_{IN}$ by additionally providing the subtracters 52, 58.

Thus, subtracting the output signals of the high frequency removing circuits 51, 57 from the L channel component $L_{IN}$ and the R channel component $R_{IN}$ by using the subtracters 52, 58 makes it possible to remove a low frequency component less than the reproducible limit of the speaker from the sound signal input to the speaker. This can solve the conventional problem of causing the speaker to have unnecessary vibration and distorting the reproduced sound. High pass filters can replace the subtracters 52, 58 to obtain the same effects, and this structure is advantageous in terms of reducing circuit size.

Figure 7:
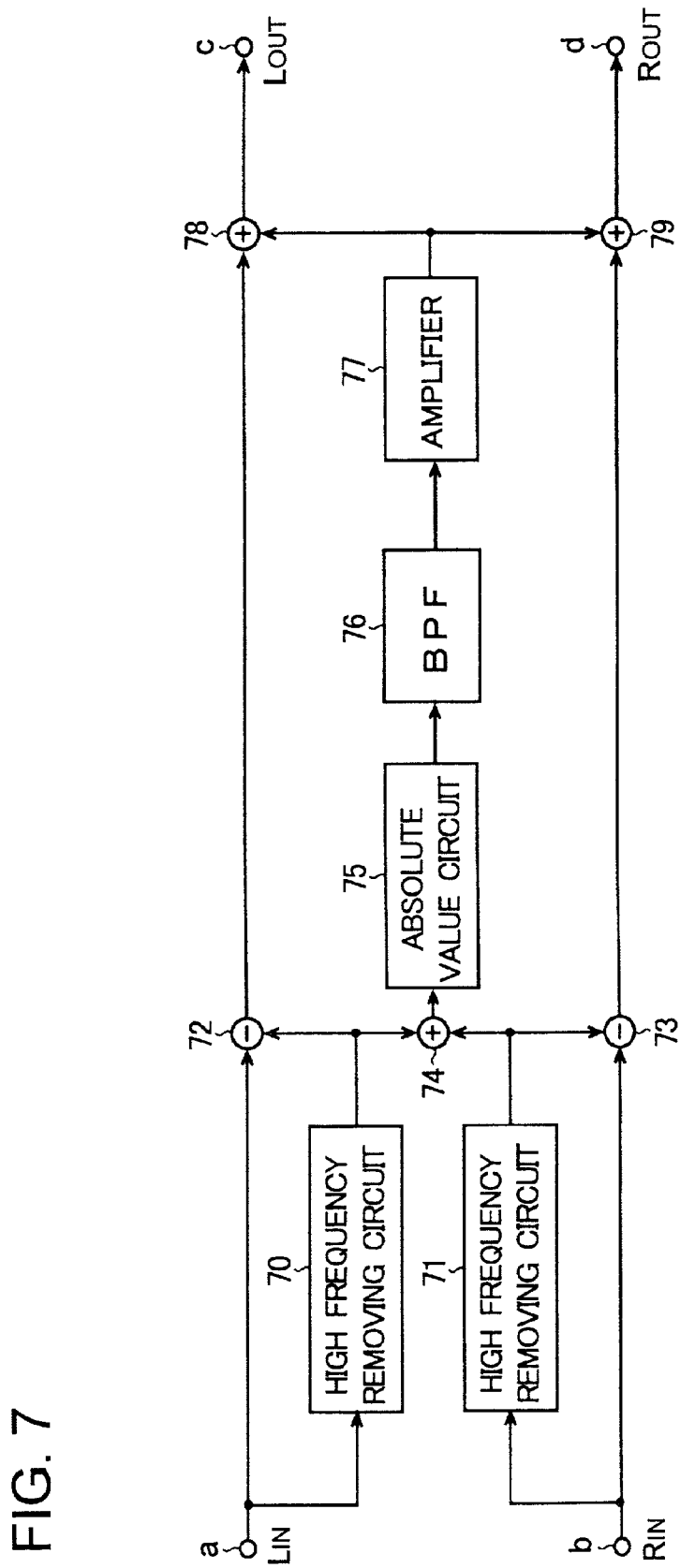
FIG. 7 is a block diagram showing the sixth embodiment of the bass compensation device of the present invention.
Figure 8:
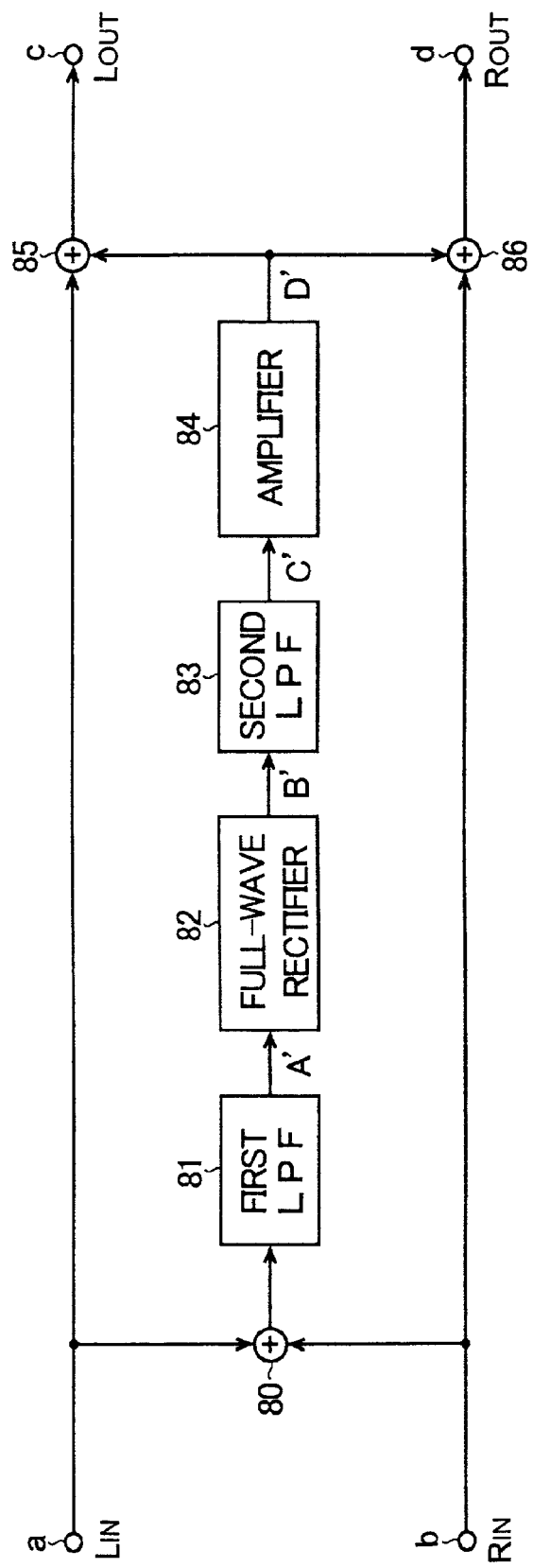
Figure 9:
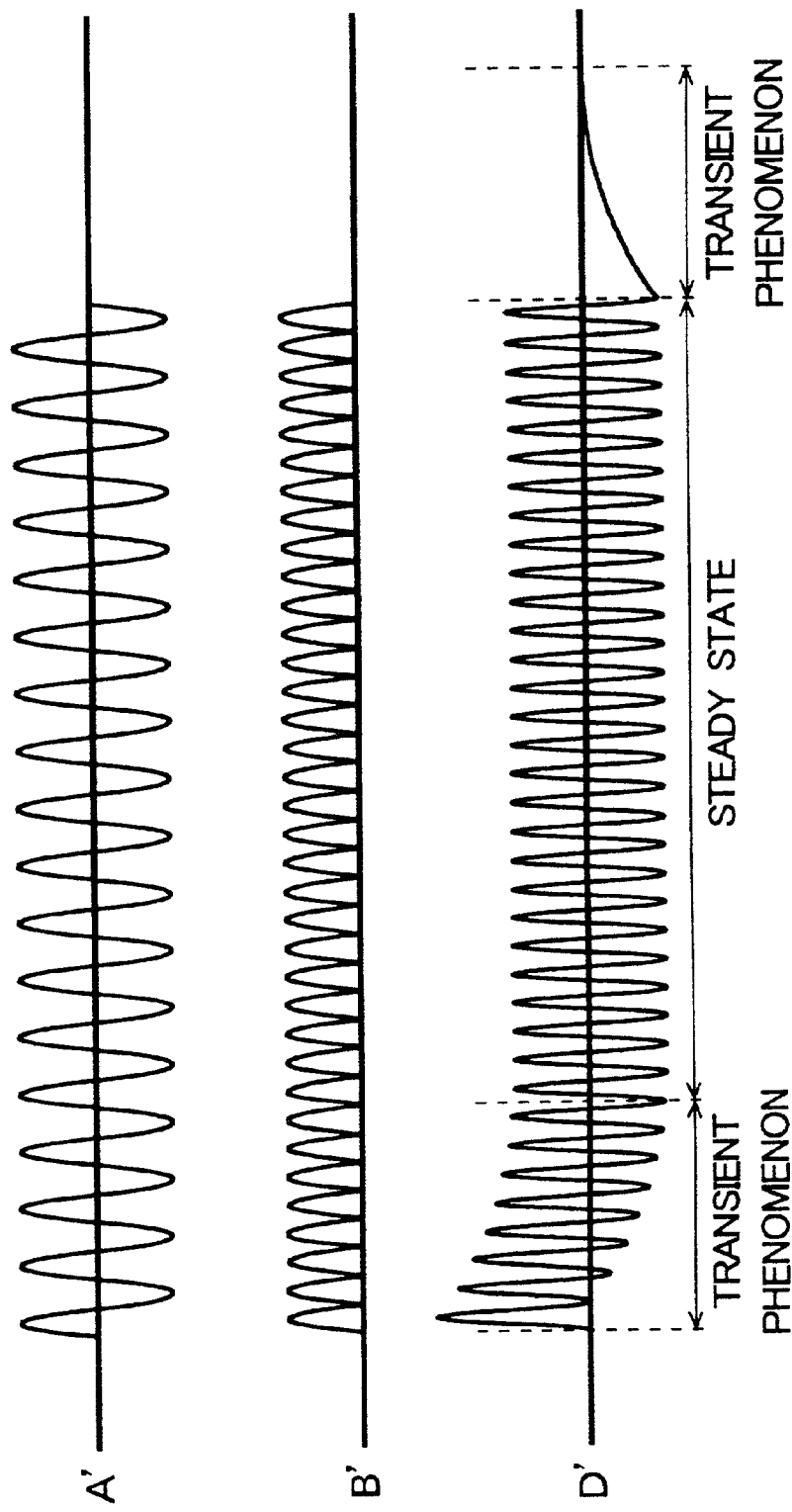
FIG. 9 is a time chart showing waveform examples of output signals A', B', and D'.

Next, the sixth embodiment of the bass compensation device of the present invention will be described. FIG. 7 is a block diagram showing the sixth embodiment of the bass compensation device of the present invention. The bass compensation device of the present embodiment is structured on the precondition that a sound signal input from the sound source is a stereo signal containing an L channel component and an R channel component.

As shown in the drawing, the bass compensation device of the present embodiment includes a high frequency removing circuit 70 which removes a high frequency component from the L channel component $L_{IN}$ of a sound signal input to the terminal "a"; a high frequency removing circuit 71 which removes a high frequency component from the R channel component $R_{IN}$ of a sound signal input to the terminal "b"; a subtracter 72 which subtracts the output signal of the high frequency removing circuit 70 from the L channel component $L_{IN}$; a subtracter 73 which subtracts the output signal of the high frequency removing circuit 71 from the R channel component $R_{IN}$; an adder for adding the output signals of the high frequency removing circuits 70, 71; an absolute value circuit 75 which full-wave rectifies the output signal of the adder 74; a band pass filter 76 (hereinafter referred to as the BPF 76) which selectively passes only a predetermined frequency range component from the output signal of the absolute value circuit 75; an amplifier 77 which amplifies the output signal of the BPF 76; an adder 78 which adds the output signal of the amplifier 77 to the output signal of the subtracter 72, and outputs the resulting signal from the terminal "c" as an L channel component $L_{OUT}$; an adder 79 which adds the output signal of the amplifier 77 to the output signal of the subtracter 73, and outputs the resulting signal from the terminal "d" as an R channel component $R_{OUT}$.

The bass compensating operations done by the high frequency removing circuits 70, 71, the absolute value circuit 75, the BPF 76, and the amplifier 77, and the low frequency component removing operations done by the subtracters 72, 73 are the same as in the fifth embodiment, so detailed descriptions will be omitted. This structure makes it possible to unify the signal system necessary for the bass compensating operations. Consequently, the circuit size can be reduced compared with the bass compensation device of the fifth embodiment.

What is claimed is:

1. A bass compensation device, comprising:
  a high frequency removing circuit for removing a high frequency component of an input sound signal;
  an absolute value circuit for full-wave rectifying an output signal of said high frequency removing circuit;
  a band pass filter circuit for selectively passing only a predetermined frequency range component from an output signal of said absolute value circuit;
  an amplifier for amplifying an output signal of said band pass filter circuit; and
  a subtracter for subtracting the output signal of said high frequency removing circuit from said input sound signal,
  wherein bass compensation is performed by an output signal of said amplifier, while using an output signal of said subtracter as an output sound signal.

2. The bass compensation device of claim 1, further comprising an adder for adding the output signal of said amplifier to the output signal of said subtracter, wherein an output signal of said adder is used as an output sound signal.

3. The bass compensation device of claim 1, wherein a cut-off frequency of said high frequency removing circuit is set lower than a frequency range of high frequency noise.

4. The bass compensation device of claim 1, wherein a cut-off frequency of said high frequency removing circuit is set at a bass-side reproducible frequency limit of a speaker to be connected with.

5. The bass compensation device of claim 1, wherein plural stages of harmonic tone circuit units composed of said absolute value circuit and said band pass filter circuit are connected in serial between said high frequency removing circuit and said amplifier.

6. A bass compensation device comprising:

a first and a second high frequency removing circuit for removing high frequency components of input sound signals of two systems;

a first and a second subtracter for subtracting output signals of the first and the second high frequency removing circuit from said input sound signals of two systems;

an adder for adding output signals of the first and the second high frequency removing circuit;

an absolute value circuit for full-wave rectifying an output signal of said adder;

a band pass filter circuit for selectively passing only a predetermined frequency range component from an output signal of said absolute value circuit; and an amplifier for amplifying an output signal of said band pass filter circuit, wherein bass compensation is performed by an output signal of said amplifier, while using output signals of the first and the second subtracter as output sound signals of two systems.

7. The bass compensation device of claim 6, wherein plural stages of harmonic tone circuit units composed of said absolute value circuit and said band pass filter circuit are connected in serial between said adder and said amplifier.

8. The bass compensation device of claim 6, further comprising a first and a second adder for adding the output signal of said amplifier to said input sound signals of two systems, respectively, wherein output signals of the first and the second adder are used as output sound signals of two systems.

9. The bass compensation device of claim 6, wherein cut-off frequencies of the first and the second high frequency removing circuit are set lower than a frequency range of high frequency noise.

10. The bass compensation device of claim 6, wherein cut-off frequencies of the first and the second high frequency removing circuit are set at a bass-side reproducible frequency limit of a speaker to be connected with.

11. A sound system composed of a sound source for generating sound signals, a bass compensation device for performing bass compensation of the sound signals input from the sound source, and a sound output device for outputting sound signals input from said sound source and said bass compensation device as sound, said sound system, as said bass compensation device, comprising:

a high frequency removing circuit for removing a high frequency component of a sound signal input from said sound source;

an absolute value circuit for full-wave rectifying an output signal of said high frequency removing circuit;

a band pass filter circuit for selectively passing only a predetermined frequency range component from an output signal of said absolute value circuit;

an amplifier for amplifying an output signal of said band pass filter circuit; and a subtracter for subtracting the output signal of said high frequency removing circuit from the sound signal input from said sound source, wherein bass compensation of the sound signals input from said sound source is performed by an output signal of said amplifier, while using an output signal of said subtracter as an output sound signal.

* * * * *